(12) United States Patent
Huber et al.

(10) Patent No.: US 7,675,799 B2
(45) Date of Patent: Mar. 9, 2010

(54) METHOD OF OPERATING A MEMORY CELL, MEMORY CELL AND MEMORY UNIT

(75) Inventors: Peter Huber, Munich (DE); Martin Ostermayr, Feldkirchen (DE)

(73) Assignee: Infineon Technologies AG, Munich (DE)

( * ) Notice: Subject to any disclaimer, the term of this patent is extended or adjusted under 35 U.S.C. 154(b) by 355 days.

(21) Appl. No.: 11/710,859

(22) Filed: Feb. 26, 2007

(65) Prior Publication Data

US 2008/0205182 A1    Aug. 28, 2008

(51) Int. Cl.
*G11C 7/00* (2006.01)

(52) U.S. Cl. .................. 365/222; 365/200; 365/201; 365/226; 365/228; 365/189.09; 365/154; 365/156

(58) Field of Classification Search .............. 365/154, 365/156, 200, 201, 226, 228, 189.09
See application file for complete search history.

(56) References Cited

U.S. PATENT DOCUMENTS

| | | | |
|---|---|---|---|
| 3,765,000 A * | 10/1973 | Regitz | 365/187 |
| 4,127,901 A * | 11/1978 | Horne et al. | 365/205 |
| 6,347,050 B1 | 2/2002 | Mukai et al. | |
| 6,549,451 B2 * | 4/2003 | Jain | 365/154 |
| 6,621,727 B2 * | 9/2003 | Chen | 365/154 |
| 6,628,551 B2 | 9/2003 | Jain | |
| 2005/0237786 A1* | 10/2005 | Atwood et al. | 365/156 |
| 2006/0118865 A1* | 6/2006 | Schuler et al. | 257/338 |

FOREIGN PATENT DOCUMENTS

DE    10 2005 029 872 A1    4/2007

* cited by examiner

*Primary Examiner*—VanThu Nguyen
*Assistant Examiner*—Eric Wendler
(74) *Attorney, Agent, or Firm*—Slater & Matsil, L.L.P.

(57) ABSTRACT

A memory system and method are described. For example, a memory cell includes a capacitance and an access circuit in association with the capacitance and having an access circuit terminal. The memory cell further includes a voltage control unit to adjust a potential at the access circuit terminal in a retention state such that a retention time of the memory cell is increased. A method of operating a memory cell includes, for example, adjusting a potential at an access circuit terminal of the memory cell to increase a retention time.

42 Claims, 8 Drawing Sheets

METHOD OF OPERATING A MEMORY CELL, MEMORY CELL AND MEMORY UNIT

BACKGROUND

The present invention relates to a method of operating a memory cell, a memory cell and a memory unit. In particular, the present invention relates to memory cells that comprise a capacitance to store information in the form of a charging state.

BRIEF DESCRIPTION OF THE DRAWINGS

Hereinafter, exemplary embodiments of the invention will be described with reference to the drawings.

DETAILED DESCRIPTION OF ILLUSTRATIVE EMBODIMENTS

In the following, exemplary embodiments of the present invention will be described in detail. It is to be understood that the following description is given only for the purpose of illustrating the principles of the invention and is not to be taken in a limiting sense. Rather, the scope of the invention is defined only by the appended claims and is not intended to be limited by the exemplary embodiments described hereinafter.

It is also to be understood that, in the following description of exemplary embodiments, any direct connection or coupling between functional blocks, devices, components, or other physical or functional units shown in the drawings or described herein could also be implemented by an indirect connection or coupling.

It is to be understood that the features of the various exemplary embodiments described herein may be combined with each other, unless specifically noted otherwise.

The present invention generally relates to memory cells and, in particular, to memory cells that comprise only three transistors, also referred to as 3T-memory cells.

Figure 1:
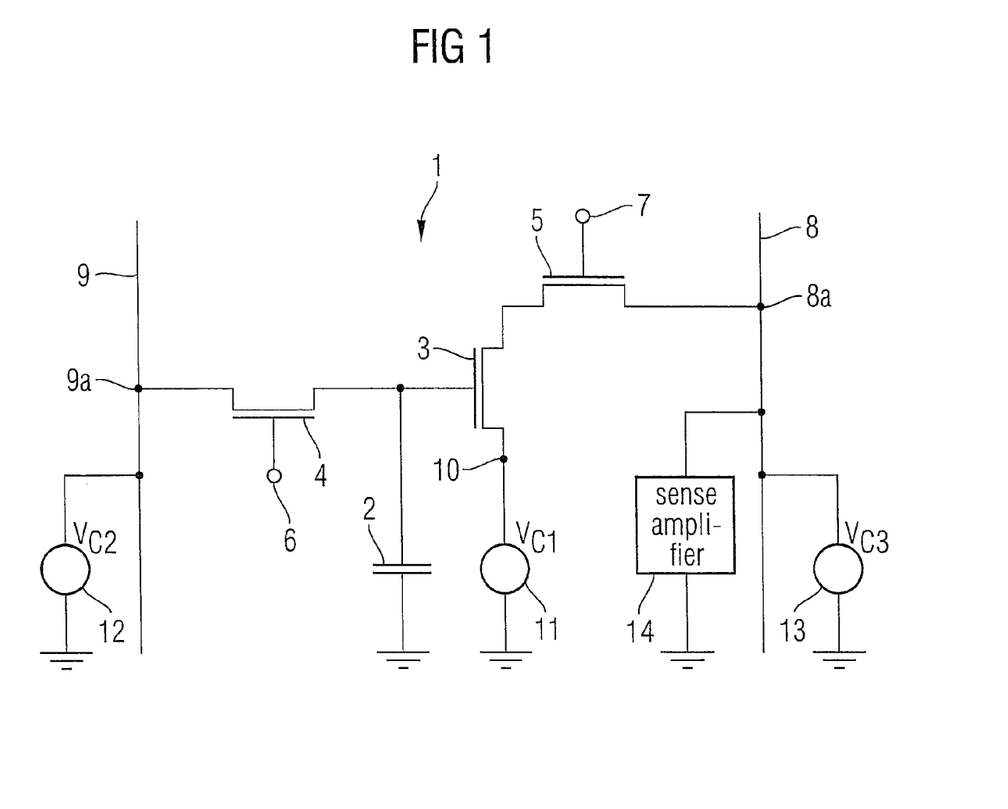
FIG. 1 is a schematic circuit diagram of a memory cell according to an exemplary embodiment of the invention.

FIG. 1 is a schematic circuit diagram showing a memory cell 1 according to an exemplary embodiment of the present invention. The memory cell 1 comprises a capacitor 2 and three transistors 3, 4 and 5. For illustrative purposes only, it will be assumed that each of the transistors 3-5 is an NMOS-transistor. However, it will be appreciated that the invention is not limited thereto and that the transistors could also be implemented as any other suitable transistor, e.g., as PMOS-transistors.

One terminal of the capacitor 2 is connected to a gate terminal of the transistor 3, while the other terminal of the capacitor 2 is connected to ground. In another exemplary embodiment, the terminal of the capacitor 2 that is not connected to the gate terminal of the transistor 3 could also be held at a reference potential other than ground. The transistors 3 and 5 are interconnected in a series configuration, a source terminal of transistor 5 being connected to a drain terminal of transistor 3. The drain terminal of transistor 5 and the source terminal of transistor 3 serve as read terminals 8a, 10, respectively, that are utilized in a read operation of the memory cell 1, as will be explained more fully below. A gate terminal of transistor 5 serves as a read access control terminal 7 of the memory cell 1. By suitably adjusting a potential at the read access control terminal 7, a read operation of the memory cell 1 is initiated. In the exemplary embodiment of FIG. 1, the transistors 3, 5 in combination form a read access circuit that allows read out of the memory cell 1, more specifically of the charging state of capacitor 2.

A source terminal of the transistor 4 is coupled to the capacitor 2, and a drain terminal of the transistor 4 forms a write terminal 9a of the memory cell 1. A gate terminal of the transistor 4 forms a write access control terminal 6 of the memory cell 1. By appropriately adjusting a potential at the write access control terminal 6, a write operation of the memory cell may be initiated. In the exemplary embodiment of FIG. 1, the transistor 4 thus forms a write access circuit that allows the memory cell to be accessed in a write operation and, more specifically, to charge the capacitor 2 to one of two charging states that represent a binary "0" and "1", respectively.

The memory cell 1 is connected to a write line 9 at the write terminal 9a, and to a read line 8 at the read terminal 8a. Controllable voltage sources 12, 13 providing variable voltages $V_{c2}$ and $V_{c3}$, respectively, are coupled to the write line 9 and the read line 8, respectively, to adjust a potential at which the read and write lines 8, 9 are held. Another adjustable voltage source 11 having a variable voltage $V_{c1}$ is coupled to the source terminal of transistor 3 to adjust a potential at the read terminal 10 of the memory cell. In an exemplary embodiment, the write line 9 is a write bit line and the read line 8 is a read bit line, while the write access control terminal 6 is coupled to a write word line and the read access control terminal 7 is coupled to a read word line. In another exemplary embodiment, the write access control terminal 6 and the read access control terminal 7 may both be coupled to the same word line.

Further coupled to the read line 8 is a sense amplifier 14 that, in the exemplary embodiment of FIG. 1, senses a potential at the read line 8 as a function of time. As will be described in more detail with reference to FIG. 2 below, the sense amplifier 14 may detect a charging state of the capacitor 2 by monitoring the potential of the read line 8 in a read operation.

The operation of the memory cell 1 in various operation states, namely in a write operation, a precharge operation, a read operation and in a retention state, will be explained next.

In order to store or write information into the memory cell 1, the potential at the write line 9 is set to a desired level that corresponds to the information to be stored. For illustrative purposes only, it will be assumed hereinafter that a potential of $V_{SS}$ corresponds to a logical or binary "0", while a potential of $V_{DD}$ corresponds to a logical "1". Once the write line 9 is at the desired potential, the potential at the write access control terminal 6 is adjusted in such a way that the source-drain-path of the transistor 4 becomes conducting, i.e., the transistor 4 makes a transition to the state in which it has a low source-drain resistance. The resulting current flow between the write line 9 and the capacitor 2 will result in the capacitor 2 being charged or being discharged, until the terminal of the capacitor 2 that is coupled to the gate terminal of transistor 3 is at the desired potential, namely $V_{SS}$ or $V_{DD}$, respectively. Once the capacitor 2 has been charged or discharged to the desired charging state, the transistor 4 is returned to the state in which the source-drain-path has high resistance by appropriately adjusting the potential at the write access control terminal 6, thereby completing the write operation. During the write operation, the read access control terminal 7 is held at a potential so that the source-drain-path of transistor 5 is in a high-resistance state, while the read terminals 8a and 10 may be held at arbitrary potentials. In an embodiment, read terminal 10 is held at $V_{DD}$ during the write operation.

A read operation is preceded by a precharge operation in which the read line 8 is precharged to a predetermined potential, e.g., $V_{DD}$. The precharging may be achieved utilizing the controllable voltage source 13. In the subsequent read operation, the voltage source 13 is decoupled from the read line 8, and the potential at terminal 10 of the memory cell is adjusted to a value different from the potential at the read line 8. In an exemplary embodiment, the controllable voltage source 11 adjusts the potential at terminal 10 to be equal to $V_{SS}$ in the read operation.

Figure 2A:
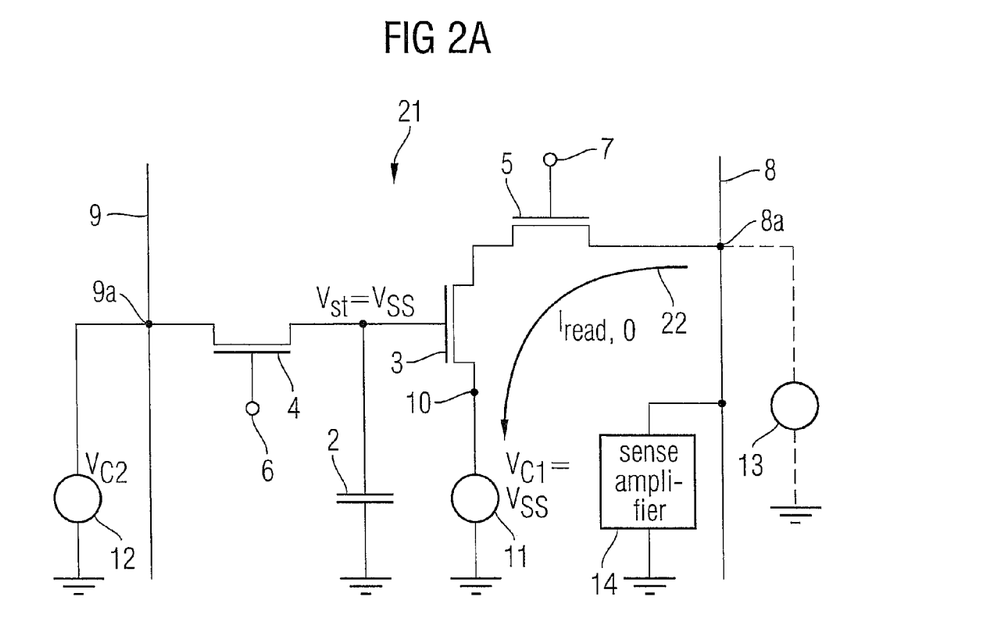
FIGS. 2A and 2B, collectively referred to as FIG. 2, are schematic circuit diagrams of the memory cell of FIG. 1 indicating current flows in a read operation.
Figure 2B:
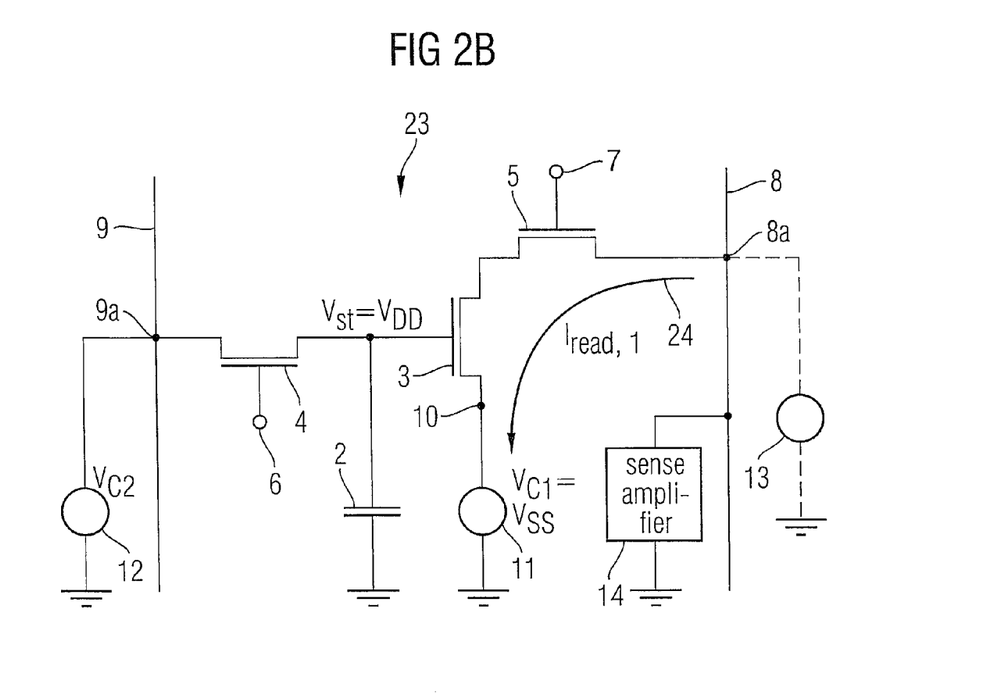

FIG. 2 schematically shows the state of the memory cell 1 during a read operation, FIG. 2A representing the read operation for a logical "0", and FIG. 2B representing the case in which a logical "1" is stored in the memory cell 1. As schematically indicated in FIGS. 2A and 2B by dashed lines, the voltage source 13 is decoupled from the read line 8 in the read operation, and the voltage source 11 is controlled such that the potential at terminal 10 is at $V_{SS}$. By applying a suitable voltage at the read access control terminal 7, the source-drain-path of transistor 5 is switched to a low-resistance state, thereby initiating the read operation. Due to the different potentials at the read line 8 and the terminal 10, a current will flow between the read line 8 and the terminal 10 when the transistor 5 is switched to its conducting state. However, since the gate terminal of transistor 3 is held at different potentials depending on whether a logical "0" or "1" is stored in the memory cell, the magnitude of the current flowing between the read line 8 and the terminal 10 will be dependent on the potential at the gate terminal of transistor 3, i.e., on the state stored in the memory cell. As shown in FIG. 2A, when the gate terminal of transistor 3 is at $V_{SS}$, a current 22 having magnitude $I_{read,0}$ will flow between the read line 8 and the terminal 10, the magnitude $I_{read,0}$ usually being small. By contrast, for the case in which the potential at the gate terminal of transistor 3 is at $V_{DD}$, schematically shown in FIG. 2B, due to the smaller drain-source-resistance of transistor 3 the current 24 flowing between the read line 8 and the terminal 10 will have a magnitude $I_{read,1}$ that is larger than $I_{read,0}$. Correspondingly, the potential at the read line 8 will change at a higher rate when a logical "1" is stored by the memory cell. The change in potential of the read line 8 may be sensed by sense amplifier 14. In an exemplary embodiment, the sense amplifier 14 may compare the potential at read line 8 at a predetermined time $t_{read}$ after the read process has been initiated to a predetermined reference voltage $V_{ref}$ and may amplify the difference.

Figure 3:
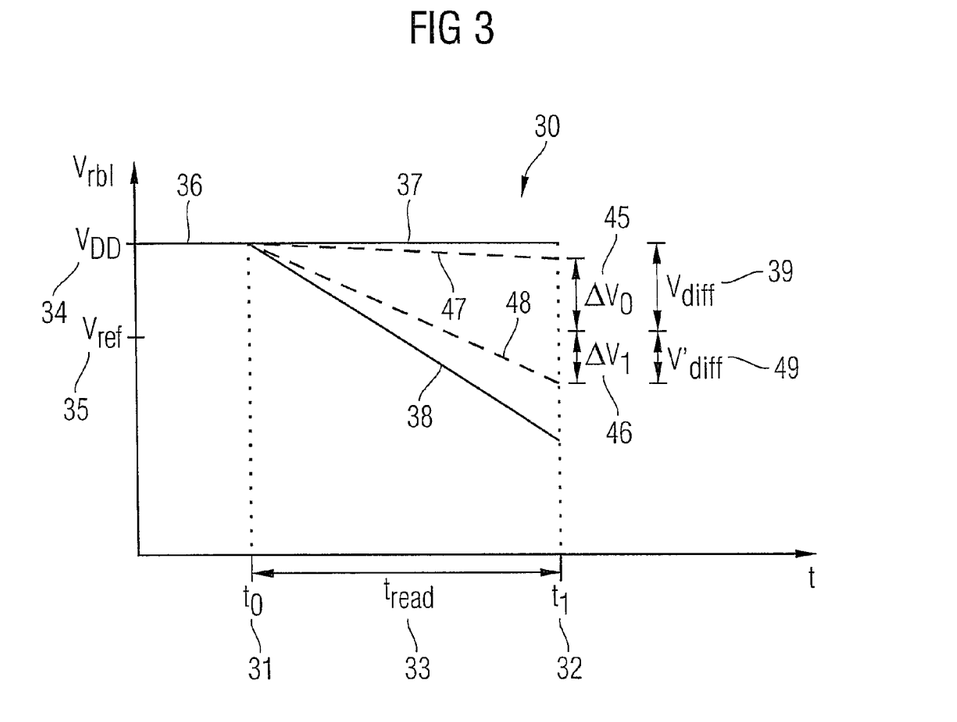
FIG. 3 is a schematic representation of time-dependent potentials in a read operation.

FIG. 3 is a schematic representation 30 showing the potential at the read line 8 as a function of time in a read operation. After precharging, the read line 8 is at a potential $V_{DD}$ 34, indicated by a solid line 36. At time $t_0$ 31, the read operation is started by adjusting the potential at the read access control terminal. If the memory cell has a logical "0" stored therein, the potential at read line 8 remains approximately constant, as shown by line 37, due to the small magnitude of the current $I_{read,0}$. By contrast, the larger magnitude of the current $I_{read,1}$ for the case in which the memory cell has a logical "1" stored therein leads to a pronounced decrease of the potential at the read line 8, as shown by line 38. After an interval $t_{read}$ 33, at a time $t_1$ 32 the sense amplifier amplifies a difference between the potential at the read line 8 and a predetermined reference potential $V_{ref}$ 35 and determines the charging state of the capacitor 2 based on the amplified potential difference. Suitably, the reference potential $V_{ref}$ 35 is selected so that it lies between the potentials of the read line for states "0" and "1" at time $t_1$ 32, so that the storage state of the memory cell may be discriminated by the polarity of the voltage between the read line and the reference potential.

As will be appreciated, a reliable readout of the memory cell requires the difference between the potential at the bit line and the reference voltage for both storage states "0" and "1" at time $t_1$ 32 to be greater than the sensitivity of the sense amplifier. The solid lines 37, 38 shown in FIG. 3 represent the case in which the potential at the gate terminal of transistor 3 is equal to $V_{SS}$ or $V_{DD}$ at the time of the read operation, respectively, i.e., to a case in which the read operation starts at a time shortly after completion of the write operation. Generally, the potential at the terminal of capacitor 2 that is coupled to the gate terminal of transistor 3 will be subject to time variations that take place between the write and read operations, due to, for example, parasitic currents that will be explained more fully below. When the charging state of the capacitor 2 varies between the write and read operation, the potential at the read line 8 in the read operation will deviate from the one schematically shown at lines 37 and 38, respectively, in FIG. 3.

Typical time-dependent potentials that may result from longer wait times between write and read operations are shown at dashed lines 47, 48 in FIG. 3. As may be seen, the curve 47 associated with the logical "0" state is shifted downward for a longer wait time, owing to the fact that the potential at the gate terminal of transistor 3 has been increased due to parasitic currents. Similarly, the curve 48 associated with the logical "1" is shifted upward, owing to charge leaking away from the capacitor terminal that is coupled to the gate terminal of transistor 3. As may also be seen in FIG. 3, the change in the potential of the read line as a function of wait time between write and read operations decreases the potential differences to the reference potential $V_{ref}$ 35 at time $t_1$ 32. Both states of the memory cell can still be read out when the potential differences $\Delta V_0$ 45 and $\Delta V_1$ 46 are larger than the sensitivity of the sense amplifier, the smaller one of the potential differences determining whether both states can still be read out reliably. For the exemplary scenario shown in FIG. 3, the potential difference V'$_{diff}$ 49 that has to be compared with the sense amplifier sensitivity is equal to $\Delta V_1$ 46.

As shown in the schematic representation 50 of FIG. 4, the potential difference $V_{diff}$ defined as the smaller one of $\Delta V_0$ and $\Delta V_1$, as explained with reference to FIG. 3 above, is a decreasing function 51 of the wait time between write and read operations. The time at which the potential difference $V_{diff}$ 51 becomes smaller than the sense amplifier sensitivity $V_{sa}$ 52 determines the retention time $t_{ret}$ 53, which is the maximum time between a write or refresh operation and a read operation that allows both storage states to be reliably retrieved. Therefore, a memory cell has to be refreshed at the latest after a time $t_{ret}$.

Figure 4:
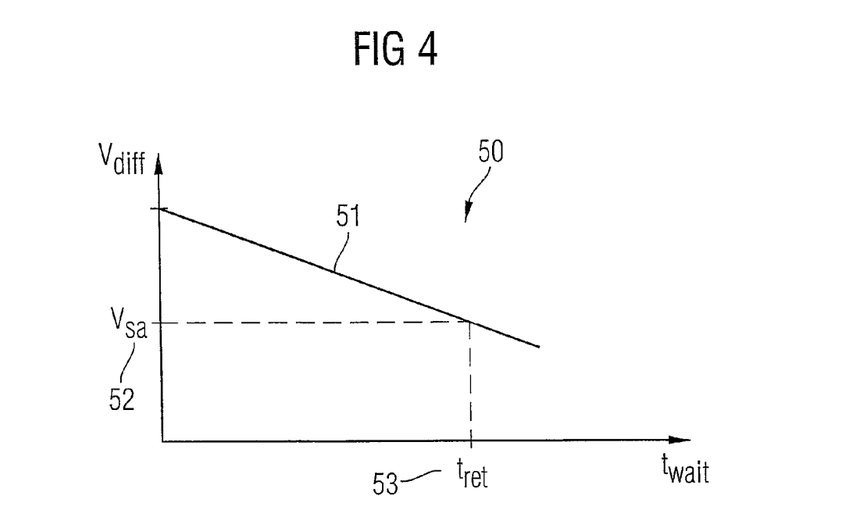
FIG. 4 is a schematic representation of a potential difference in a read operation as a function of storage time.

It will be appreciated that, although the retention time of the memory cell has been explained above with reference to a given read out mechanism illustrated in FIGS. 3 and 4, the term "retention time" as used herein is generally defined as the maximum time after a write operation for which both logical states of the memory cell may still be read out. The retention time will depend on the implementation of the read-out process and the configuration of the read-out componentry.

With reference to FIGS. 5-7, exemplary modes of operating the memory cell of FIG. 1 will be explained next. As will be detailed below, according to various exemplary embodiments, the retention time may be enhanced. According to one embodiment, a potential at a terminal of the memory cell, e.g., one of the read terminals or the write terminal, is adjusted so that a leakage current onto or from the capacitor 2 through transistors 3, 4 is reduced for one of the storage states of the memory cell, i.e., for one of the charging states of the capacitor. In one exemplary embodiment, the charging state for which the leakage current is reduced is selected to be the charging state which limits the retention time. In one exemplary embodiment, the leakage current may be reduced by reducing a gate tunneling current through transistor 3. As used herein, the term "leakage current" refers to any current that involves a current flow through a depleted region, the term thus including currents such as tunneling currents, sub-threshold currents or similar.

FIGS. 5-7 show the memory cell of the exemplary embodiment of FIG. 1 in a retention state. As used herein, the term "retention state" refers to any state in which the memory cell is not accessed for a read or write operation and is not in the precharge state.

Figure 5A:
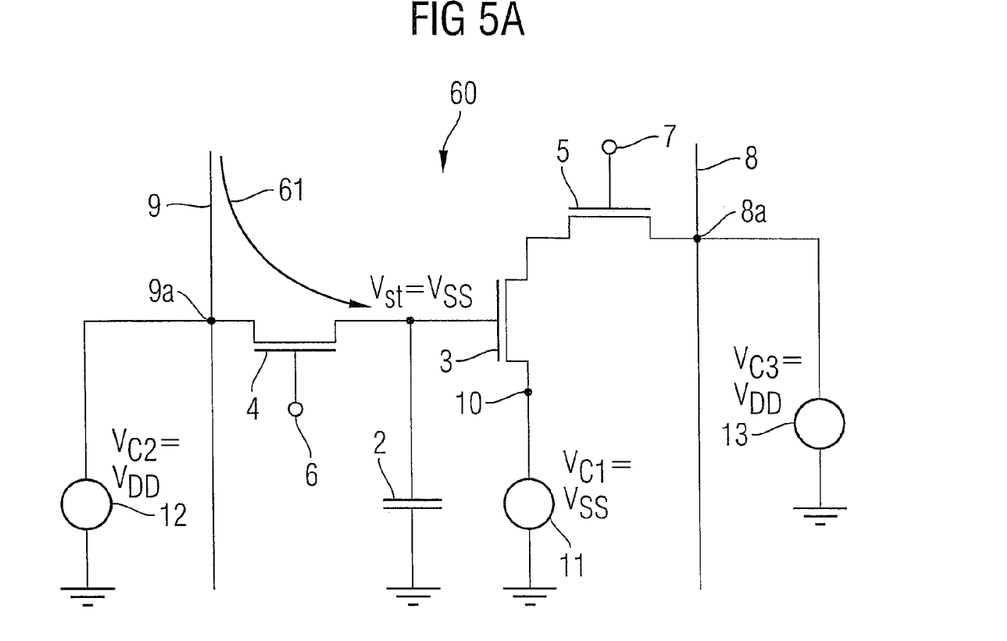
FIGS. 5A and 5B, collectively referred to as FIG. 5, are schematic circuit diagrams illustrating current flows in a retention state in one mode of operating the memory cell of FIG. 1.
Figure 5B:
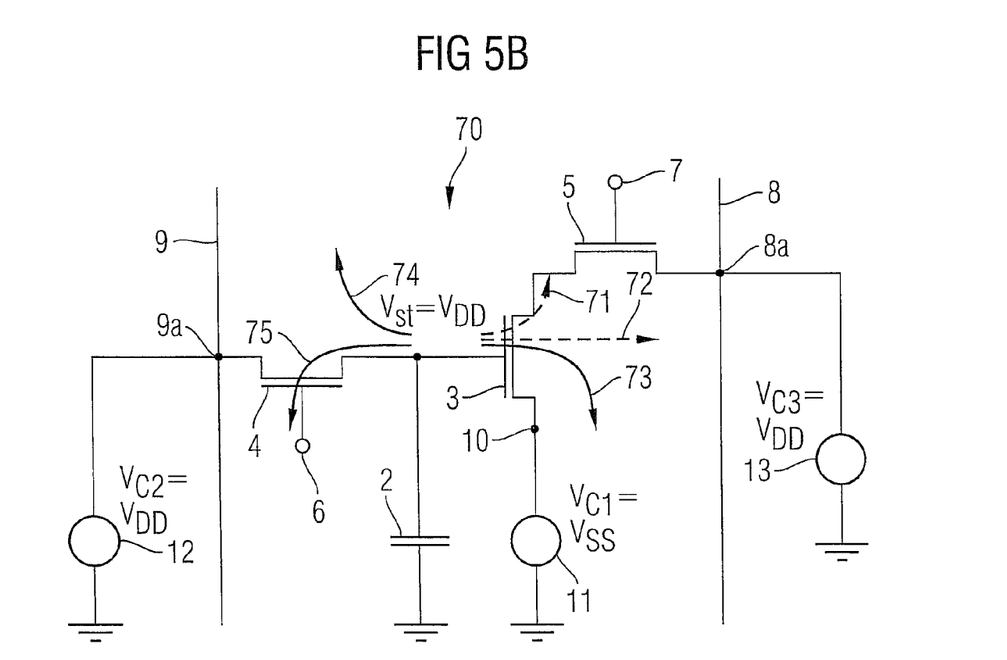

FIG. 5 schematically illustrates a method of operating a memory cell in the retention state according to an exemplary embodiment, FIG. 5A illustrating a state 60 in which a logical "0" is stored in a memory cell and FIG. 5B illustrating a state 70 in which a logical "1" is stored in the memory cell, respectively. In the retention state shown in FIGS. 5A und 5B, the controllable voltage sources 11-13 are controlled in such a way that the read and write lines 8 and 9 and, thus, the read and write terminals 8a and 9a, respectively, of the memory cell are held at a potential $V_{DD}$, and the terminal 10 of the memory cell is held at a potential $V_{SS}$. If a logical "0" is stored in the memory cell, i.e., if the terminal of the capacitor 2 that is coupled to the gate terminal of transistor 3 is at potential $V_{SS}$, a leakage current 61 will flow through transistor 4 to the capacitor 2, thereby increasing the potential at the capacitor terminal that is coupled to the gate terminal of transistor 3. This leakage current comprises, in particular, a diode leakage current 61 between the drain and source terminals of transistor 4.

If a logical "1" is stored in the memory cell, leakage currents 71-73 and 74, 75 will flow from the capacitor 2 through transistors 3 and 4, respectively, as shown in FIG. 5B. Contributions to the leakage current through transistor 3 include gate tunneling currents 71, 73 from the gate terminal of transistor 3 to the source and drain terminals of transistor 3, respectively, and a gate-substrate tunneling current 72 from the gate terminal of transistor 3 to the substrate. Contributions to the leakage current through transistor 4 include a current 74 from the source terminal of the transistor 4 to the substrate and a gate tunneling current 75 from the source terminal of transistor 4 to the gate terminal of transistor 4.

It will be appreciated that, by adjusting the potential at the write terminal 9a to $V_{DD}$, a subthreshold current from the source terminal to the drain terminal of transistor 4 is eliminated for the case in which a logical "1" is stored by the memory cell. This elimination of the subthreshold current through transistor 4 comes at the expense of a finite subthreshold current through transistor 4 for the case that a logical "0" is stored. Therefore, by adjusting the potential at the write terminal 9a to $V_{DD}$, the total magnitude of the leakage current is increased for the logical "0" and is decreased for the logical "1" compared to a state in which the write terminal 9a is held at $V_{SS}$. In this manner, by suitably adjusting the potential at the write terminal 9a in the retention state, the logical "1" is strengthened at the expense of weakening the logical "0".

As will be described in more detail with reference to FIG. 8 below, by suitably strengthening one of the storage states at the expense of the other, an increased retention time is achievable.

Figure 6A:
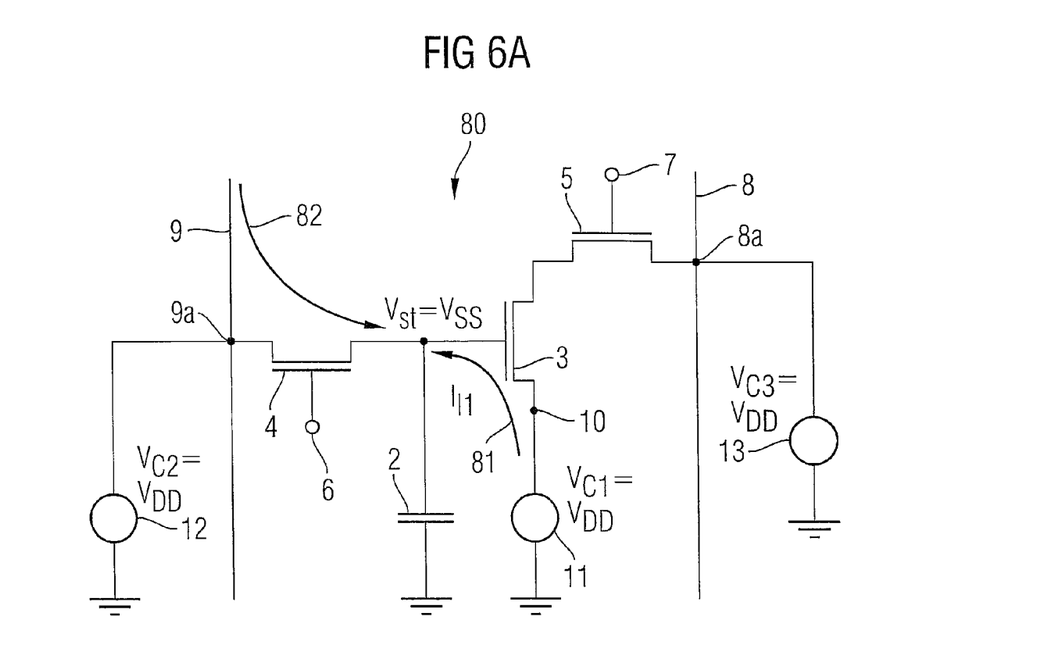
FIGS. 6A and 6B, collectively referred to as FIG. 6, are schematic circuit diagrams illustrating current flows in the retention state in another mode of operating the memory cell of FIG. 1.
Figure 6B:
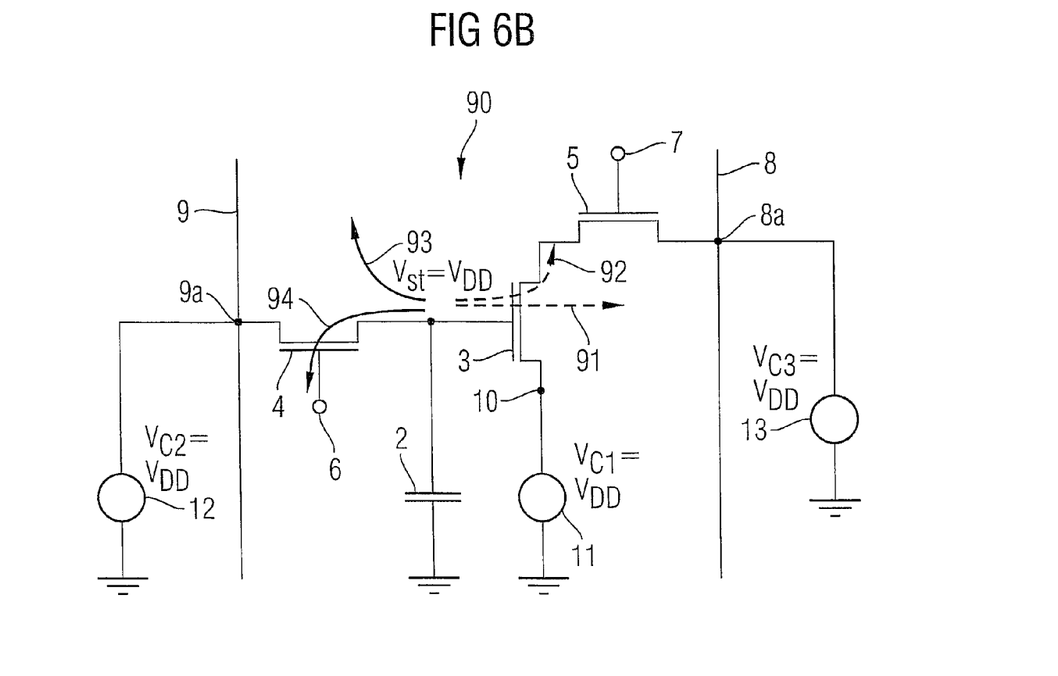

FIG. 6 schematically illustrates a method for operating a memory cell in the retention state according to another embodiment, the illustration 80 of FIG. 6A representing the case in which a logical "0" is stored in the memory cell and the illustration 90 of FIG. 6B representing the case in which a logical "1" is stored in the memory cell. The controllable voltage sources 12, 13 again adjust the potential at the write and read lines 9, 8 and, thus, at the write and read terminals 9a, 8a, respectively, to $V_{DD}$. Further, in the exemplary embodiment of FIG. 6, in the retention state the controllable voltage source 11 provides a voltage $V_{DD}$ so that the terminal 10 of the memory cell is also held at potential $V_{DD}$. As schematically shown in FIG. 6A, when a logical "0" is stored and the terminal of the capacitor 2 that is coupled to the gate terminal of transistor 3 is at potential $V_{SS}$, leakage currents 81 and 82 flow through transistors 3 and 4, respectively, to the terminal of the capacitor 2 that is coupled to the gate terminal of transistor 3. The current 81 includes a gate tunneling current through transistor 3 flowing from the source terminal to the gate terminal of this transistor, due to terminal 10 being held at potential $V_{DD}$ in the exemplary embodiment of FIG. 6.

As is shown in FIG. 6B, when a logical "1" is stored in the memory cell and the terminal of the capacitor 2 coupled to the gate terminal of transistor 3 is at potential $V_{DD}$, leakage currents 91, 92 and 93, 94 flow from the capacitor 2 through transistors 3 and 4, respectively, contributions to the leakage current flowing through transistor 3 including a tunneling current 91 from the gate terminal to the substrate and a tunneling current 92 from the gate terminal to the drain terminal of transistor 3. However, by adjusting the potential at terminal 10 to $V_{DD}$, a gate tunneling current from the gate terminal to the source terminal of the transistor 3 is eliminated or, at least, reduced. Thus, by adjusting the potential at terminal 10 to $V_{DD}$, a total leakage current flowing onto capacitor 2 through the transistors 3, 4 is further increased for the state in which a logical "0" is stored, and is further decreased for the case in which a logical "1" is stored, as compared to the method shown in FIG. 5. By adjusting the potential at terminal 10 of the memory cell as shown in FIG. 6, the logical "1" may be further strengthened at the expense of further weakening the logical "0", the terms "strengthening" and "weakening" referring to a making the states less and more prone to deterioration due to leakage currents, respectively.

Figure 7A:
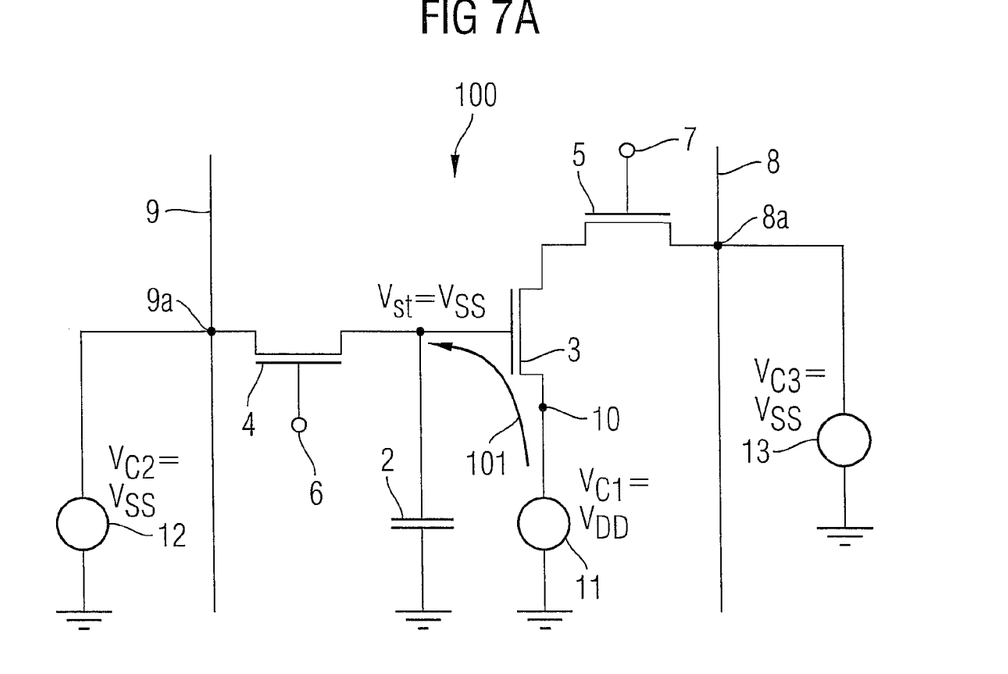
FIGS. 7A and 7B, collectively referred to as FIG. 7, are schematic circuit diagrams illustrating current flows in the retention state in another mode of operating the memory cell of FIG. 1.
Figure 7B:
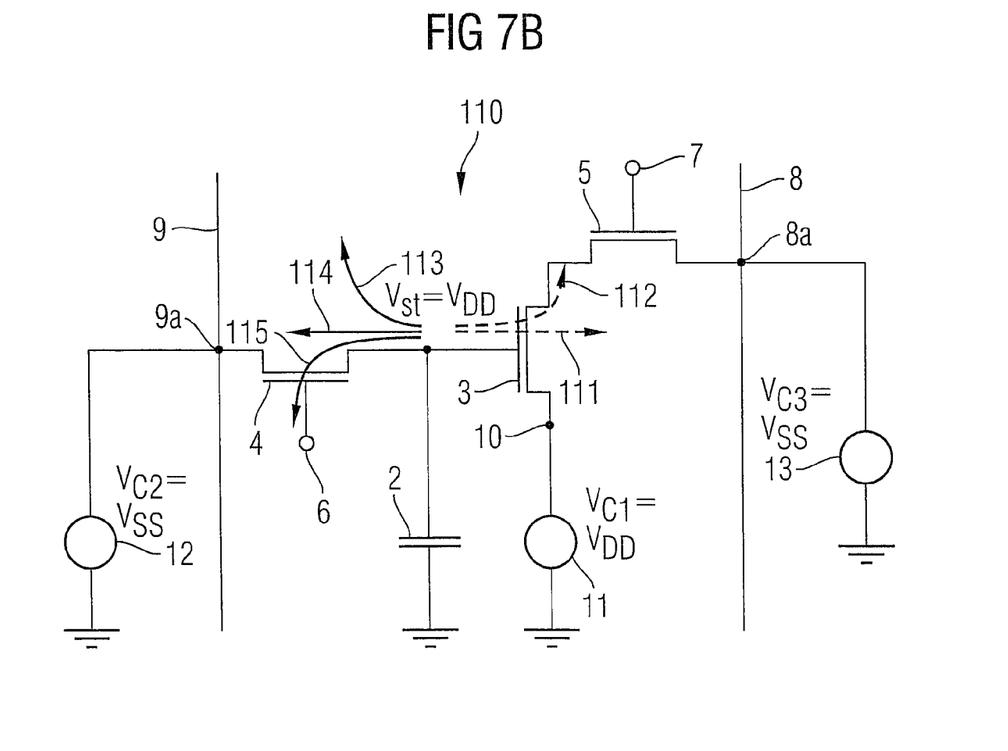

FIG. 7 schematically illustrates a method of operating the memory cell in the retention state according to yet another exemplary embodiment of the present invention. The illustration 100 of FIG. 7A depicts the circuit diagram and current flows for a logical "0", while the illustration 10 of FIG. 7B illustrates the state in which a logical "1" is stored. In the exemplary embodiment of FIG. 7 the controllable voltage sources 12 and 13 hold the write and read lines 9 and 8 and, thus, the write terminal 9a and read terminal 8a, respectively, at potential $V_{SS}$. The controllable voltage source 11 adjusts the potential at terminal 10 to $V_{DD}$. When a logical "0" is stored in the memory cell, the leakage current comprises a gate tunneling current 101 from the source terminal to the gate terminal of transistor 3. For the case in which a logical "1" is stored in the memory cell, there are finite leakage currents through both transistor 3 and transistor 4. More specifically, charge is removed off capacitor 2 by gate tunneling currents 111 and 112 flowing from the gate terminal of transistor 3 to the substrate and the drain terminal of transistor 3, respectively, and by a substrate current 113 flowing from the source terminal of transistor 4 to the substrate, a sub-threshold current 114 flowing from the source terminal to the drain terminal of transistor 4 and a gate tunneling current 115 flowing from the source terminal to the gate terminal of transistor 4.

It is to be understood that any currents shown in FIGS. 5-7 and explained above are included only for illustrative purposes. It will be appreciated that other leakage mechanisms or parasitic currents may be present in the memory cell, e.g., a parasitic discharge current in the capacitor 2. It will further be appreciated that the charging or discharging of the capacitor 2 in a retention state due to leakage currents is a non-linear process, and that all currents shown in the drawings and explained above may therefore be time-varying.

Figure 8:
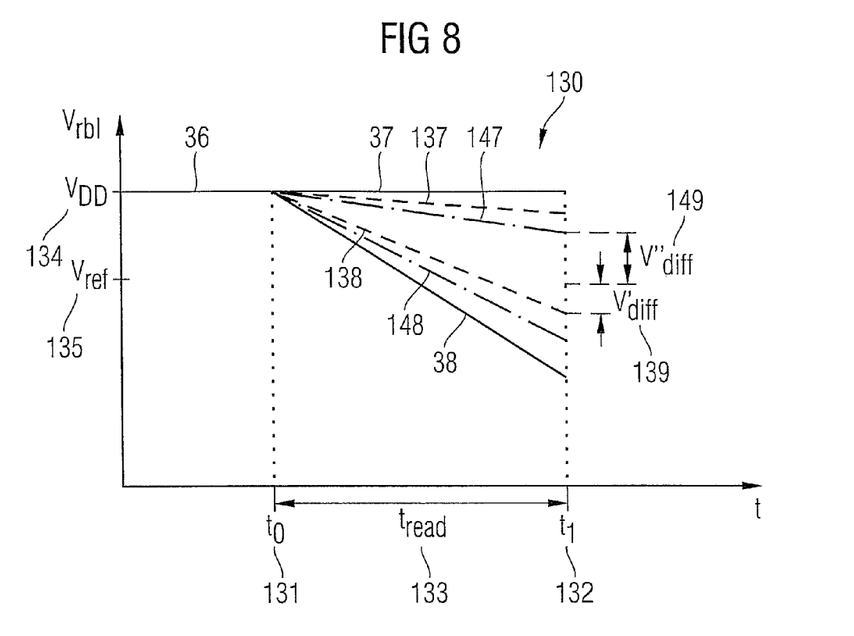
FIG. 8 is a schematic representation of time-dependent potentials in a read operation.

With reference to FIG. 8, it will next be illustrated how the retention time may be enhanced by suitably adjusting the potential at the memory cell write and read terminals as explained with reference to FIGS. 5-7 above. FIG. 8 shows a graphical representation 130 of the potential at the read line 8 during a read operation for various scenarios. Prior to starting the read operation by biasing the read access control terminal 6 at time $t_0$ 131, the potential at the read line is at $V_{DD}$ 134, as seen at line 36. For reference purposes, solid lines 37 and 38 are included to illustrate the potential variation at the read line for the case that the memory cell has stored therein a logical "0" and "1", respectively, and that the read operation starts a very short time after completion of a write operation, so that deterioration of the stored states is negligible.

For the case of a longer wait time between the write and read operation, the time-dependent potential at the read line during the read operation is schematically indicated by dashed lines 137 and 138 for a logical "0" and "1", respectively. The potential dependence as indicated by lines 137 and 138 is a characteristic potential dependence at the read line for the case in which the terminals of the memory cell, i.e., read terminals 8a and 10 and write terminal 9a, are for example all held at $V_{SS}$ in the retention state, so that there are only negligible leakage currents through the transistors if the memory cell has a logical "0" stored therein, and the potential variation 137 at the read line remains close to the ideal one indicated by line 37. By contrast, due to leakage currents through transistors 3 and 4 and through capacitor 2, the logical state "1" is more prone to deterioration, leading to a substantial deviation of the potential variation 138 from the ideal behavior indicated by line 38. Due to the pronounced deviation, the logical "1" will be the state which limits the retention time, the retention time being reached when the potential difference $V'_{diff}$ 139 between the potential obtained for a logical "1" at the end of the read operation, i.e., at time $t_1$ 132, and the reference potential $V_{ref}$ 135 becomes less than the sense amplifier sensitivity.

In this case, improved retention times may be obtained by increasing the leakage currents flowing through transistors 3 and 4 to capacitor 2 in the case in which a logical "0" is stored, and by decreasing the magnitude of the leakage currents flowing through transistors 3 and 4 in the case in which a logical "1" is stored, employing for example any one of the methods according to exemplary embodiments that have been explained with reference to FIGS. 5-7 above. Typical time-varying potentials that may be obtained utilizing such methods of operating the memory cell in the retention state are schematically illustrated by dashed-dotted lines 147 and 148 for a logical "0" and "1", respectively. As may be seen, due to the weakening of the logical "0", the time dependent potential 147 is further shifted away from the ideal line 37. By contrast, due to the strengthening of the logical "1", the time dependent potential 148 is shifted towards the ideal line 38, thereby increasing the potential difference between the potential at the read line at time $t_1$ 132 and the reference potential $V_{ref}$ 135. For the illustrated example shown by dashed-dotted lines in FIG. 8, the retention time is now limited by the logical "0" rather than the logical "1". However, the potential difference $V''_{diff}$ 149 between the read line potential at time $t_1$ 132 and the reference potential $V_{ref}$ 135 is substantially larger than the potential difference $V'_{diff}$ 139 obtained when all memory cell terminals are held at $V_{SS}$ in the retention state.

As may be seen from FIG. 8, by suitably adjusting the potential at the write and read terminals of the memory cell during the retention state it becomes possible to selectively strengthen the state which limits the retention time. In one embodiment, the potentials at the read terminals and the write terminal of the memory cell are selected in such a way that a magnitude of a total leakage current from or onto the capacitor 2 becomes comparable for the logical "0" and the logical "1". In another embodiment, the potentials at the write and read terminals of the memory cell are adjusted such that a potential difference between the read line potential at the end of the read operation and the reference potential is approximately equal for the logical "0" and the logical "1".

It will be appreciated that the methods of operating the memory cell in the retention state that have been explained with reference to FIGS. 5-8 above are only illustrative and are not to be taken in a limiting sense. Rather, many modifications and variations may be implemented in other embodiments. For example, in one embodiment, the logical "0" may be strengthened at the expense of weakening the logical "1". In one embodiment, the logical state that is strengthened, i.e., the logical state for which a magnitude of a total leakage current is decreased, is selected to be the state which limits the retention time. While, in the exemplary embodiments of FIGS. 5-7, the write terminal 9a and the read terminals 8a, 10 are shown to be biased to either $V_{SS}$ or $V_{DD}$, the embodiments of the present invention are not limited to these potentials. Rather, in other embodiments, the read and write terminals may be held at any other suitable potential. In one embodiment, the read terminal 10 may for example be biased to a potential larger than $V_{DD}$.

Further, while in the methods of operating the memory cell explained with reference to FIGS. 5-7 above, the potential at the read and write terminals of the memory cell is adjusted independently of the state stored in the memory cell, according to another embodiment, the potentials may be adjusted based on the state that is stored in the memory cell. According to one embodiment, in the retention state the controllable voltage source 11 adjusts the potential at terminal 10 to $V_{SS}$ when a logical "0" is stored and to $V_{DD}$ when a logical "1" is stored. According to another embodiment, in the retention state the voltage sources 11-13 adjust the potential at the write terminal 9a and at both read terminals 8a, 10 to $V_{SS}$ when a logical "0" is stored and to $V_{DD}$ when a logical "1" is stored.

While the method of operating the memory cell has been explained with reference to the retention state above, it will be appreciated that, according to further embodiments, the potentials at the write and read terminals of the memory cell may also be suitably adjusted in other operation states of the memory cell. For example, in one embodiment, the potential at the read terminal 10 may also be adjusted to $V_{DD}$ in the precharge state.

Figure 9:
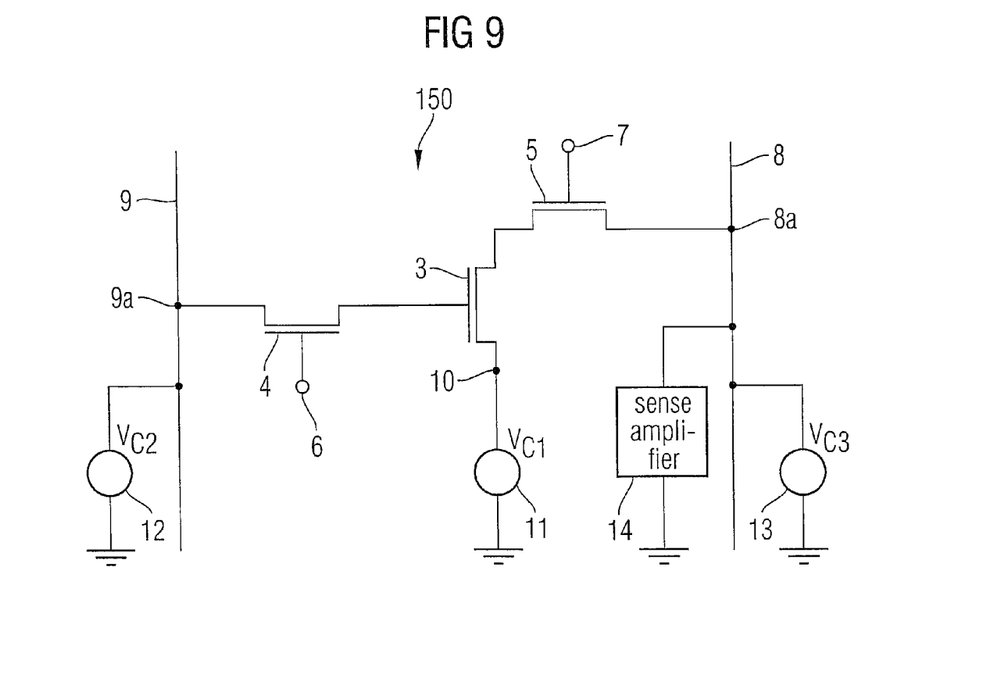
FIG. 9 is a schematic circuit diagram of a memory cell according to another exemplary embodiment of the invention.

Further, it is also to be understood that many modifications of the configuration of the memory cell shown in FIG. 1 may be implemented in other embodiments. FIG. 9 shows a circuit diagram of a memory cell 150 according to another embodiment of the invention. While the exemplary memory cell 1 of FIG. 1 is shown to comprise a capacitor 2, the memory cell 150 of FIG. 9 employs a parasitic capacitance, e.g., the gate capacitance of transistor 3 for storing a charge corresponding to one of the two logical states. The other configuration of the memory cell 150 is essentially identical to the one of the memory cell 1. As will be appreciated, the memory cell 150 can be operated in the same as the memory cell 1. In particular, the potential at the read terminals 8a and 10 and at the write terminal 9a may be suitably adjusted using the controllable voltage sources 11-13 in the retention state.

While various embodiments of the present invention have been explained with reference to a single memory cell above, other embodiments of the present invention may also be implemented using a plurality of memory cells.

Figure 10:
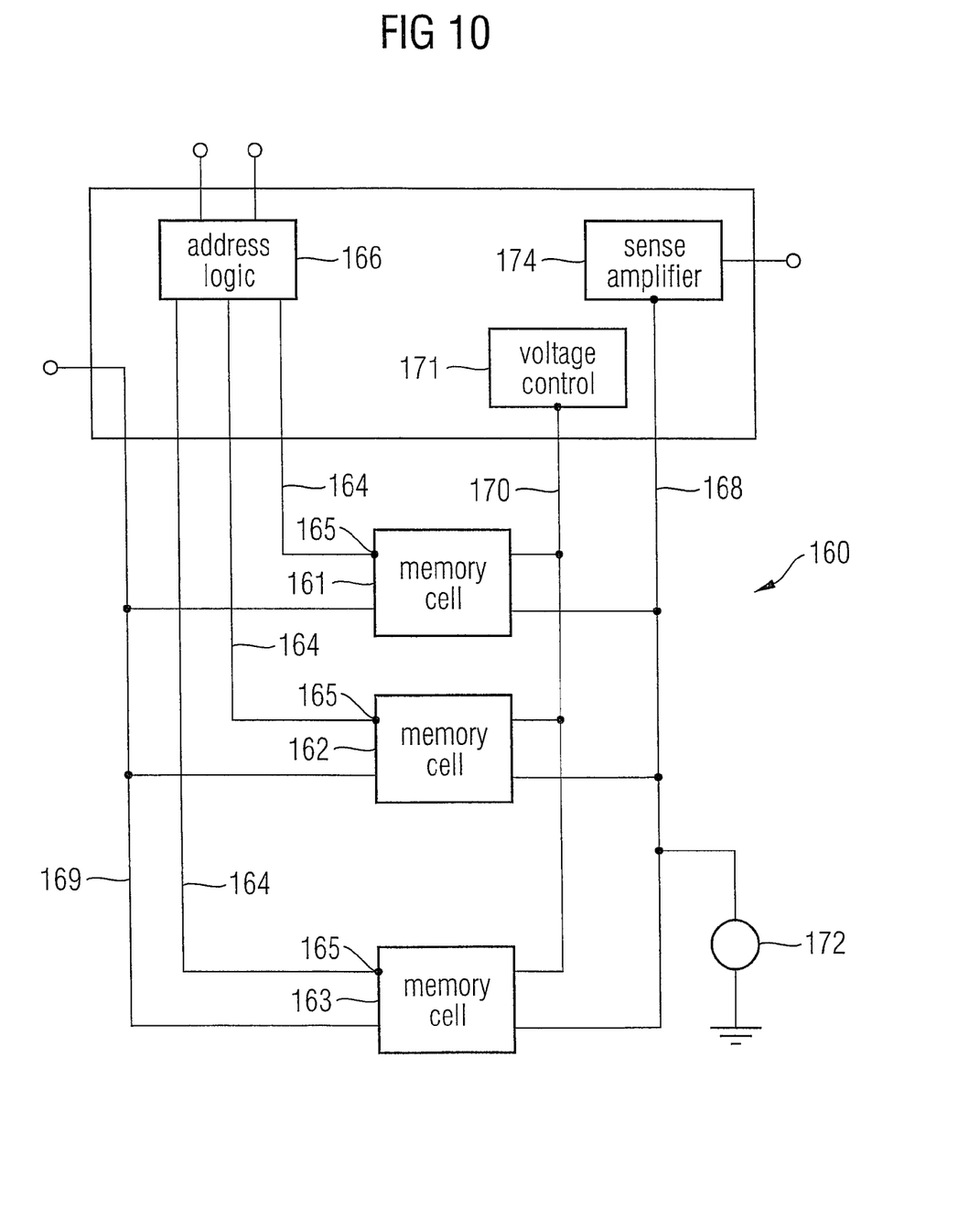
FIG. 10 is a schematic block diagram of a memory unit according to an embodiment of the invention.

FIG. 10 is a schematic block diagram representation of a memory unit 160 comprising three memory cells 161-163, each of which may have a configuration as explained with reference to any one of the exemplary embodiment above. Each of the memory cells 161-163 has a control input 165 that is respectively coupled to both the read access control terminal and the write access control terminal of the memory cells 161-163. The control inputs 165 of memory cells 161-163 are coupled to an address logic 166 via lines 164, the address logic 166 adjusting a potential at the lines 164 based on which of the memory cells 161-163 is to be written into or read. The memory cells 161-163 are further coupled to a write line 169, the potential at which is adjusted according to the logical state which is to be written into one of the memory cells 161-163. Each of the memory cells is further coupled to a pair of read lines 168, 170 that are utilized in a read operation. Read line 168 is coupled to a voltage source 172 that adjusts a potential at the read line 168 and, in particular, precharges the read line 168 to a predetermined potential, e.g., $V_{DD}$, in a precharge operation, and is decoupled from the read line 168 in a read operation. The read line 168 is further coupled to an amplifier 174 that senses the potential at the read line 168 during a read operation to determine the state of the memory cell 161-163 that is read. A voltage control unit 171 is coupled to the read line 170 to adjust the potential at read terminals of the memory cells 161-163. In a read operation, the voltage control unit 171 holds the read line 170 at a predetermined potential, e.g., $V_{SS}$, so that the state of the memory cell to be read may be determined from a current flow between read line 168 and read line 170.

In an embodiment, the voltage control unit 171 may adjust the potential at the read line 170 and, thus, at the corresponding read terminals of the memory cells 161-163 in a retention state such that a retention time of the memory cells 161-163 is increased. As used in the context of exemplary embodiments in which a plurality of memory cells are coupled to write and read lines, the term "retention state" refers to a state in which none of the memory cells is accessed for a write or read operation, respectively. Any one of the methods that have been described with reference to a single memory cell above may also be utilized for operating the memory unit 160 of FIG. 10. In one embodiment, in the retention state the voltage control unit 171 adjusts the potential at read line 170 to the potential that corresponds to the logical state which limits the memory cell retention time. In one embodiment, the voltage control unit 171 adjusts the potential at the read line 170 to a value of at least $V_{DD}$. In another embodiment, the voltage control unit 171 adjusts the potential at the read line 170 based on the states stored in the memory cells 161-163.

While the present invention has been explained with reference to specific exemplary embodiments above, it is to be understood that this description is given only for the purpose of better illustrating the principles of the invention and is by no means to be taken in a limiting sense. Rather, modifications and variations of the above exemplary embodiments may be implemented in other embodiments that still fall within the spirit and scope of the present invention. For example, while the present invention has been described with reference to an implementation in which the transistors of the memory cell are implemented as NMOS transistors, any other suitable transistor may be employed. In one further exemplary embodiment, all transistors of the memory cell are implemented as PMOS-transistors. Still further, it will in particular be appreciated that any value specified for a potential, such as $V_{DD}$ or $V_{SS}$, in the above description of exemplary embodiments, is given only for illustrative purposes, and that these values may be replaced by any other suitable first and second potential. It will be appreciated that all such embodiments are intended to be comprised of the present invention as long as they fall within the scope and spirit of the present invention as defined by the appended claims.

What is claimed is:

1. A method of operating a memory cell, said memory cell comprising a capacitance having first and second charging states and an access circuit in association with said capacitance to store information in or to read information from the memory cell, said access circuit comprising an access circuit terminal, wherein said access circuit comprises a transistor having a gate terminal, said capacitance being in association with said gate terminal, said method comprising:

setting a potential at said access circuit terminal to a first potential in at least one of a read or write operation; and adjusting said potential at said access circuit terminal in a retention state of said memory cell to a second potential different from said first potential, said second potential being selected such that a retention time of said memory cell is increased and a gate tunneling current between said capacitance and said access circuit terminal is adjusted.

2. The method of claim 1, wherein said potential is adjusted to said second potential such that a magnitude of a leakage current between said capacitance and said access circuit terminal is reduced for one of said first and second charging states relative to a state in which said access circuit terminal is at said first potential.

3. The method of claim 1, wherein said memory cell comprises only three transistors.

4. The method of claim 1, wherein said second potential is selected based on a charging state of said capacitance.

5. The method of claim 2, wherein said second potential is selected such that said magnitude of said leakage current between said capacitance and said access circuit terminal is increased for another one of said first and second charging states.

6. The method of claim 2, wherein said one charging state is a charging state that limits said retention time.

7. The method of claim 2, wherein said second potential is selected such that a total leakage current flowing to or from said capacitance is approximately equal in magnitude for said first and second charging states.

8. The method of claim 2, wherein said access circuit comprises a transistor having a gate terminal, said capacitance being in association with said gate terminal and said leakage current comprises the gate tunneling current.

9. The method of claim 8, wherein said access circuit comprises a further access circuit terminal, the method further comprising sensing an electrical current flowing between said further access circuit terminal and said access circuit terminal to read out a charging state of said capacitance.

10. The method of claim 9, wherein a first terminal of said transistor is coupled to said further access circuit terminal and a second terminal of said transistor is coupled to said access circuit terminal.

11. A memory cell, comprising:
a capacitance having first and second charging states;
an access circuit in association with said capacitance and comprising an access circuit terminal to store information in or to read information from the memory cell, said access circuit comprising a transistor having a gate terminal, said capacitance being in association with said gate terminal; and
a voltage control unit to adjust a potential at said access circuit terminal, said voltage control unit being configured to set a potential at said access circuit terminal to a first potential in at least one of a read or write operation and to adjust said potential at said access circuit terminal to a second potential in a retention state of said memory cell to adjust a gate tunneling current between said capacitance and said access circuit terminal, said second potential being different from said first potential and being selected such that a retention time of said memory cell is increased.

12. The memory cell of claim 11, wherein said voltage control unit adjusts said potential at said access circuit terminal to said second potential such that a magnitude of a leakage current between said capacitance and said access circuit terminal is reduced for one of said first and second charging states relative to a state in which said access circuit terminal is at said first potential.

13. The memory cell of claim 11, wherein said memory cell comprises only three transistors.

14. The memory cell of claim 11, wherein said voltage control unit adjusts said second potential based on a charging state of said capacitance.

15. The memory cell of claim 12, wherein said voltage control unit adjusts said potential at said access circuit terminal to said second potential such that said magnitude of said leakage current is increased for another one of said first and second charging states.

16. The memory cell of claim 12, wherein said one charging states is a charging state that limits said retention time.

17. The memory cell of claim 12, wherein said voltage control unit adjusts said potential at said access circuit terminal to said second potential such that a total leakage current flowing to or from said capacitance is approximately equal in magnitude for said first and second charging states.

18. The memory cell of claim 12, wherein said leakage current comprises the gate tunneling current.

19. The memory cell of claim 18, wherein said capacitance comprises an intrinsic capacitance of said transistor.

20. The memory cell of claim 18, wherein said capacitance comprises a capacitor coupled to said gate terminal.

21. The memory cell of claim 18, comprising a current sensing unit, wherein said access circuit comprises a further access circuit terminal, said current sensing unit being coupled to said further access circuit terminal to sense a current flowing between said further access circuit terminal and said access circuit terminal to read out a charging state of said capacitance.

22. The memory cell of claim 21, wherein a first terminal of said transistor is coupled to said further access circuit terminal and a second terminal of said transistor is coupled to said access circuit terminal.

23. A method of operating a memory cell, said memory cell comprising a capacitance having first and second charging states and a transistor having a gate terminal, a first terminal and a second terminal, said capacitance being in association with said gate terminal of said transistor, said method comprising:
adjusting a potential at said second terminal of said transistor in a retention state of said memory cell to reduce a magnitude of a leakage current between said gate terminal of said transistor and said second terminal of said transistor for one of said first and second charging states, the leakage current comprising a gate tunneling current.

24. The method of claim 23, wherein said potential at said second terminal of said transistor in said retention state is adjusted such that said magnitude of said leakage current is reduced relative to a magnitude of said leakage current during a write or read operation.

25. The method of claim 23, wherein said memory cell comprises a first access transistor having a gate terminal, a first terminal and a second terminal, said second terminal of said first access transistor being coupled to said first terminal of said transistor, the method comprising:
adjusting a potential at said gate terminal of said first access transistor to perform a read operation.

26. The method of claim 23, wherein said gate terminal of said transistor is at a predetermined potential for said one charging state of said capacitance, wherein said potential at said second terminal of said transistor is adjusted to said predetermined potential in said retention state.

27. The method of claim 23, comprising:
selecting said potential based on a charging state which limits a retention time, wherein said one charging state is said charging state which limits said retention time.

28. The method of claim 25, comprising determining a current flow between said first terminal of said first access transistor and said second terminal of said transistor to perform said read operation.

29. The method of claim 25, wherein said memory cell comprises a second access transistor having a gate terminal, a first terminal and a second terminal, wherein said second terminal of said second access transistor is coupled to said capacitance, the method comprising:
adjusting a potential at said gate terminal of said second access transistor to perform a write operation.

30. The method of claim 29, comprising;
adjusting a potential at said first terminal of said second access transistor to reduce a magnitude of a leakage current between said first terminal of said second access transistor and said second terminal of said second access transistor for said one charging state.

31. A memory cell, comprising:
- a transistor having a gate terminal, a first terminal and a second terminal;
- a capacitance having first and second charging states wherein said capacitance is in association with said gate terminal of said transistor; and
- a voltage control unit wherein said voltage control unit is coupled to said second terminal of said transistor to adjust a potential at said second terminal of said transistor in a retention state of said memory cell to reduce a magnitude of a leakage current between said gate terminal of said transistor and said second terminal of said transistor for one of said first and second charging states, wherein said leakage current comprises a gate tunneling current.

32. The memory cell of claim 31, wherein said voltage control unit adjusts said potential at said second terminal of said transistor in said retention state such that said magnitude of said leakage current is reduced relative to a magnitude of said leakage current during a write or read operation.

33. The memory cell of claim 31, comprising:
- a first access transistor having a gate terminal; and
- a first terminal and a second terminal, wherein said second terminal of said first access transistor is coupled to said first terminal of said transistor.

34. The memory cell of claim 31, wherein said gate terminal of said transistor is at a predetermined potential for said one charging state, wherein said voltage control unit adjusts said potential at said second terminal of said transistor in said retention state to said predetermined potential.

35. The memory cell of claim 31, wherein said one charging state is a charging state which limits a retention time of said memory cell.

36. The memory cell of claim 33, comprising:
- a second access transistor having a gate terminal; and
- a first terminal and a second terminal, wherein said second terminal of said second access transistor is coupled to said capacitance.

37. The memory cell of claim 36, wherein a potential at said gate terminal of said first access transistor controls a read access, and a potential at said gate terminal of said second access transistor controls a write access.

38. The memory cell of claim 37, further comprising:
- a read line coupled to said first terminal of said first access transistor; and
- a write line coupled to said first terminal of said second access transistor.

39. The memory cell of claim 36, further comprising:
- a further voltage control unit coupled to said first terminal of said second access transistor to adjust a potential at said first terminal of said second access transistor in a retention state to reduce a magnitude of a leakage current between said first terminal of said second access transistor and said second terminal of said second access transistor for said one charging state.

40. A memory unit, comprising:
- a plurality of memory cells, each comprising a capacitance having first and second charging states and a transistor having a gate terminal coupled to said capacitance and a second terminal, wherein said capacitance is associated with said gate terminal; and
- at least one voltage control unit coupled to a plurality of second terminals of said plurality of memory cells to adjust a potential at said plurality of second terminals in a retention state of said memory unit, and to adjust a gate tunneling current from said gate terminal such that a retention time of each of said plurality of memory cells is increased.

41. The memory unit of claim 40, wherein one voltage control unit is coupled to each of said plurality of second terminals to adjust said potential at said plurality of second terminals.

42. The memory unit of claim 41, wherein said voltage control unit adjusts said potential at said plurality of second terminals based on logical states stored by said plurality of memory cells.

* * * * *